United States Patent
Hopper et al.

(10) Patent No.: US 6,420,278 B1
(45) Date of Patent: *Jul. 16, 2002

(54) METHOD FOR IMPROVING THE DIELECTRIC CONSTANT OF SILICON-BASED SEMICONDUCTOR MATERIALS

(75) Inventors: Dawn M. Hopper, San Jose; Richard J. Huang, Cupertino; Lu You, Santa Clara, all of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/096,760

(22) Filed: Jun. 12, 1998

(51) Int. Cl.⁷ .................. H01L 21/31; H01L 21/469
(52) U.S. Cl. .................. 438/778; 438/623; 438/780; 438/781; 438/782
(58) Field of Search .................. 438/622, 624, 438/623, 778, 780, 781, 782, 787, 788, 790; 427/226

(56) References Cited

U.S. PATENT DOCUMENTS

| | | | | |
|---|---|---|---|---|
| 5,118,530 A | * | 6/1992 | Hanneman et al. | 427/226 |
| 5,145,723 A | * | 9/1992 | Ballance et al. | 427/397.7 |
| 5,441,765 A | * | 8/1995 | Ballance et al. | 427/228 |
| 5,470,802 A | * | 11/1995 | Gnade et al. | 438/781 |
| 5,488,015 A | * | 1/1996 | Havemann et al. | 438/624 |
| 5,523,163 A | * | 6/1996 | Ballance et al. | 428/446 |
| 5,549,934 A | | 8/1996 | Garza et al. | |
| 5,656,555 A | * | 8/1997 | Cho | 438/760 |
| 5,665,849 A | * | 9/1997 | Cho | 528/21 |
| 6,130,152 A | * | 10/2000 | Smith et al. | 438/622 |

\* cited by examiner

*Primary Examiner*—Carl Whitehead, Jr.
*Assistant Examiner*—Maria Guerrero
(74) *Attorney, Agent, or Firm*—Mikio Ishimaru

(57) ABSTRACT

An ultra-large scale integrated circuit is manufactured by using silicon-based, low dielectric constant materials in which the dielectric constant has been reduced by spinning on the dielectric to silicon wafers, eliminating soft bake steps, and heating the wafers to about 400° C. for about one hour in a vacuum or inert atmosphere.

26 Claims, 1 Drawing Sheet

METHOD FOR IMPROVING THE DIELECTRIC CONSTANT OF SILICON-BASED SEMICONDUCTOR MATERIALS

TECHNICAL FIELD

The present invention relates generally to semiconductor manufacturing and more specifically to integrated circuit manufacturing using silicon-based, low dielectric constant materials.

BACKGROUND ART

Silicon compounds, such as silicon dioxide, that can be used as coatings are particularly valuable on electronic substrates. Such coatings serve as protective coatings, inter-level dielectric layers, doped dielectric layers to produce transistor-like devices, multilayer devices, etc.

Unfortunately, development of high integration and high-density very large scale integrated circuits has progressed so rapidly that earlier silicon compounds have become less than satisfactory. The reductions in size have been accompanied by increases in switching speed of such integrated circuits, and this has increased the problems due to capacitance coupling effects between closely positioned, parallel conductive channels connecting high switching speed semiconductor devices in these integrated circuits. This has necessitated a change from using silicon dioxide, which has a dielectric constant in excess of 4.0, to the use of lower dielectric constant materials.

The combination of high density and submicron geometries has also lead to the surfaces of semiconductor substrates having relatively large protrusions and depressions with small spaces in between. This has posed serious problems for fabrication technology because of the difficulty of providing uniform depositions and subsequently planarizing such surfaces. One answer has been to use dielectrics which are deposited in liquid form. By spinning on dielectric films in a liquid form followed by a series of soft bakes and a hard bake to cause solvent evaporation, a high degree of uniformity and planarization have been achievable.

The soft bakes are performed on three different heating elements with a robot arm moving the silicon substrates from one heating element to another. The dielectric film-coated silicon substrates are heated at 150° C., 200° C., and 350° C. for 60 seconds each. This prevents curing of the dielectric film before the solvent evaporates. The hard bake at 400° C. for an hour cures the dielectric film.

The materials that have been used for the spun on dielectric films have included various organic silicon compounds in liquid solvents. These organic silicon compounds have included TBOS (tetraethoxysilane), TMOS (tetramethoxysilane), OMCTS (octamethyleyclotetrasiloxane), HMDS (hexamethyldisiloxane), SOB (trimethylsilil borxle), DADBS (diaceloxyditerliarybutoxsilane), and SOP (trimethylsilil phosphate). And the fluid carrier would be a solvent such as MIBK (methyl isobutyl ketone). One of the more commonly used silicon-based, low dielectric constant materials is HSQ (hydrogen silsesquioxane) in MIBK solvent.

HSQ has a dielectric constant of about 3.5. It has been used successfully in the past, but as further reductions in integrated circuit size and higher speeds are achieved, this dielectric constant is becoming less satisfactory also. Part of the high dielectric constant in organic silane materials is apparently due to a large amount of water containing carbon compounds (unreacted substances) within the material. A major problem is that the series of soft bakes followed by a hard bake as required to evaporate the solvent out of the organic silane materials actually causes the atomic hydrogen in the silane materials to combine with oxygen from the air to form additional entrapped water. If the temperature of the bake is increased, the heat converts the silane material to silicon oxide which has a higher dielectric constant than the silane material with entrapped water so further heating has a negative affect on the integrated circuit. If the time of the bakes is increased, the dielectric film becomes denser, and this has the negative effect of increasing the dielectric constant.

A manufacturing method of producing a silicon-based, low dielectric constant material has long been sought but has eluded those skilled in the art.

DISCLOSURE OF THE INVENTION

The present invention provides a method of manufacturing improved integrated circuits by lowering the dielectric constant of a silicon-based, low dielectric constant material coating on semiconductor wafers by relatively low temperature heating in a vacuum or inert atmosphere.

The present invention provides a method of manufacturing improved integrated circuits which helps evaporate water from and prevents the formation of water in silicon-based, low dielectric constant semiconductor coatings.

The present invention further provides a method of manufacturing improved integrated circuits using silicon-based, low dielectric constant semiconductor coatings without the formation of high dielectric constant silicon oxide.

The present invention still further provides a method of manufacturing improved integrated circuits using silicon-based, low dielectric constant semiconductor coatings having dielectric constants below 2.8.

The present invention even further provides an easier method of manufacturing improved integrated circuits.

The present invention also provides a system which eliminates the soft bake steps and reduce s the processing equipment required.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
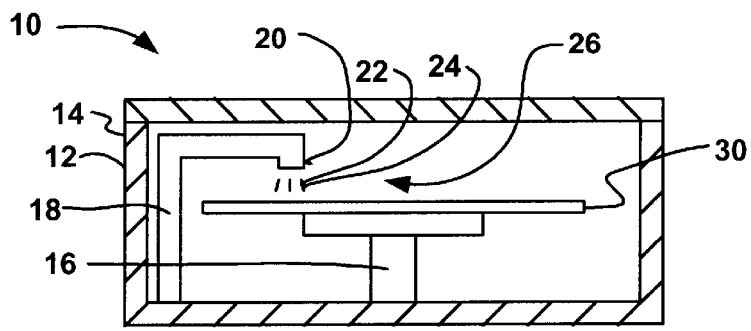
FIG. 1 is a cross-section of a spin-on coating machine for semiconductor wafers.

Referring now to FIG. 1, therein is shown a dielectric material application system which generally consists of a housing 12 with a cover 14. Inside the dielectric material application system 10, which is shown as a simplified schematic, there is a rotatable vacuum chuck 16 and a dielectric material supply system 18.

The dielectric material supply system 18 has a nozzle 20 shown with a silicon-based dielectric material 22 in a liquid solvent 24 being dispensed. Although any of the dielectric materials named in the Background Art may be dispensed, in the best mode, the material is HSQ (hydrogen silsesquioxane) in MIBK (methyl isobutyl ketone) which is designated as dielectric material fluid 26. The rotatable vacuum chuck 16 holds wafers 30 by application of vacuum and spins the wafers 30.

During spinning, the dielectric material fluid 26 is dispensed onto the top surface of the wafer 30. The spinning assures complete coverage of the wafer and helps in controlling the thickness of the dielectric fluid 26 on the wafer 30.

Figure 2:
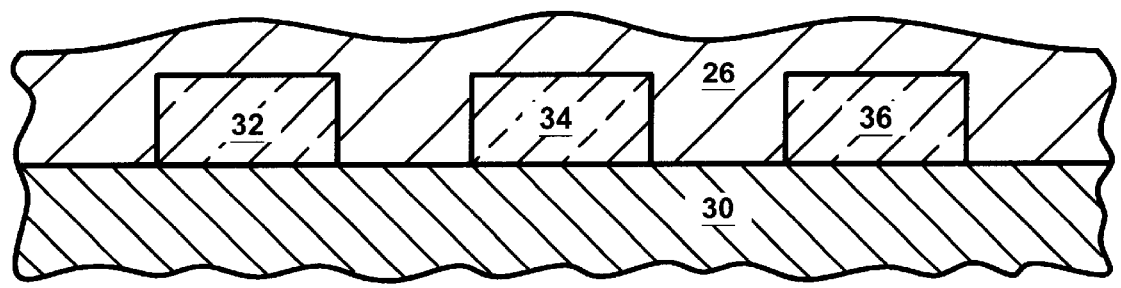
FIG. 2 is the cross-section of an improved integrated circuits with the spun-on silicon-based, low dielectric constant material coating.

Referring now to FIG. 2, therein is shown the dielectric fluid 26 after spinning but before gravity and surface tension causes it to settle and to conform to a uniform thickness on the wafer 30 and over metal lines 32, 34, and 36 of the semiconductor device.

Figure 3:
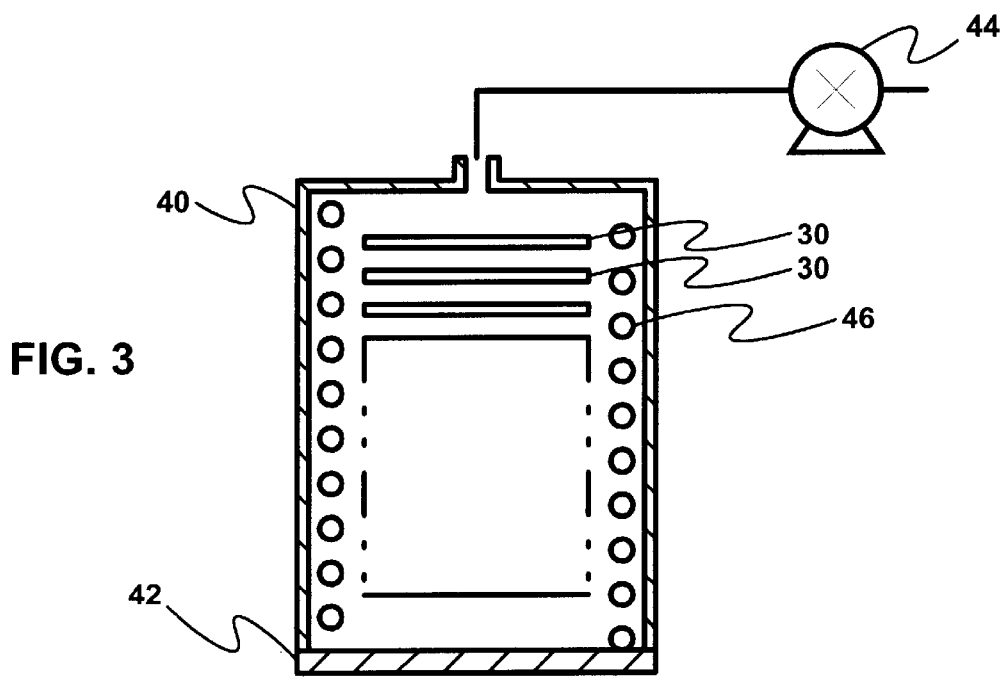
FIG. 3 is the cross-section of a vacuum oven used in the present invention.

Referring now to FIG. 3, therein is shown a chamber 40 on a sealing surface 42. The chamber 40 can contain an inert gas such as nitrogen or argon, but in the best mode the chamber 40 is connected to a vacuum pump 44 which provides a moderate level of vacuum in the milli-torr range ($10^{-3}$ torr) or above.

The chamber 40 also contains heating elements 46 which can uniformly heat the wafers 30 to temperatures around 400° C.

In manufacturing, the dielectric material application system 10 of FIG. 1 is used to coat the silicon wafer 30 with dielectric material fluid 26. When the wafer 30 is placed onto the rotatable vacuum chuck 16, a vacuum is applied to hold the wafer 30 in place. The wafer 30 is then spun up to speed and the nozzle 20 dispenses the dielectric material fluid 26 on to the top surface of the wafer 30. The thickness maybe controlled by the speed of the spin, position of the nozzle 20, the amount of fluid dispensed, and/or the ratio of dielectric material 22 to solvent 24.

Immediately after the coating of the wafer 30, the dielectric material fluid 26 will at first parallel the surface of the wafer 30 and the tops of the metal lines 32, 34, and 36 as shown in FIG. 2. Subsequently, the dielectric material fluid 26 will form a uniform film over the surface of the wafer 30 and thin out over the metal lines 32, 34, and 36.

In the prior art, there were a plurality of cylindrical heating elements, generally three, upon which the wafer 30 would be deposited by a robot arm for "soft bake". The wafer 30 would rest on the heating elements for 60 seconds at 150° C., 200° C., and 350° C. before being put into a furnace to be heated for about an hour at 400° C. for a "hard bake".

In the present invention, the soft bake steps of the prior art are eliminated. The wafer 30 with the dielectric material fluid 26 as a coating is directly inserted into the chamber 40.

The inside of the chamber 40 can then be filled with an inert atmosphere such as nitrogen or argon to displace ambient atmosphere which contains reactive oxygen. This would prevent the hydrogen in the silane material from reacting under subsequent heating with the atmospheric oxygen to form the dielectric constant increasing water.

In the best mode, the chamber 40 would be pumped down to a mild vacuum in the milli-torr range, preferably $15 \times 10^{-3}$ torr or harder, and the vacuum maintained so as to pump out the solvent and water as they evaporated out of the dielectric material fluid 26. This would maximize the purity of the dielectric material 22 itself.

While in the absence of oxygen, the wafers 30 would be heated to about 400° C. and maintained at this temperature for about an hour, and preferably between forty-five minutes and an hour and fifteen minutes. The objective would be to have a high enough temperature that the solvent and water in the dielectric material fluid 26 would be slowly evaporated out and that any entrapped oxygen would combine to form water which would also be slowly evaporated out. At the same time the temperature would be low enough to prevent the conversion of the silicon in the silicon based material from being converted into high dielectric silicon dioxide. The time should be long enough for the evaporation process to occur and cross linking of the molecules into large change polymetrics. The time should also be too short to permit significant densification of the dielectric material 22 to occur which would increase the dielectric constant.

Noting that the dielectric constant for silicon dioxide is around 4.0, for the silicon-based materials is about 3.5, the dielectric constant of the silicon-based materials with the manufacturing steps of the present invention will be from about 2.8 to 2.7.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

What is claimed is:

1. A method for manufacturing a semiconductor wafer in an oxygen containing ambient comprising the steps of:
   depositing a silicon-based, low dielectric constant material on to the semiconductor wafer;
   removing oxygen proximate said semiconductor wafer with said silicon-based, low dielectric constant material deposited thereon;
   heating said semiconductor wafer with said silicon-based, low dielectric constant material in the absence of oxygen at a temperature below the temperature at which said silicon-based, low dielectric constant material is oxidized into silicon dioxide and for a time too short to permit significant densification of said silicon-based, low dielectric constant material, whereby said silicon-based, low dielectric material is dried and the combination of removing the oxygen and heating prevents the reaction of the oxygen to water to reduce the dielectric constant.

2. The method as claimed in claim 1 wherein the step of: removing oxygen includes the step of vacuum pumping.

3. The method as claimed in claim 1 wherein the step of: removing oxygen includes the step of replacing the oxygen with an inert gas.

4. The method as claimed in claim 1 wherein the step of: heating is continued until the dielectric constant of said silicon-based, low dielectric constant material is decreased below 2.8.

5. The method as claimed in claim 1 wherein the step of: heating is continued until the dielectric constant of said silicon-based, low dielectric constant material is decreased below 2.8 and before significant densification of said silicon-based, low dielectric constant material occurs.

6. The method as claimed in claim 1 wherein the step of: depositing said silicon-based, low dielectric constant material is done by dissolving said material in a solvent and spinning said material and solvent on to said wafer.

7. The method as claimed in claim 1 wherein said step of depositing a silicon-based, low dielectric constant material on to the semiconductor wafer is immediately followed by the step of removing oxygen from around said silicon wafer.

8. The method as claimed in claim 1 wherein said step of depositing a silicon-based, low dielectric constant material on to the semiconductor wafer is immediately followed by said step of heating said semiconductor wafer while said step of removing oxygen is performed.

9. A method for manufacturing a semiconductor wafer in an oxygen containing ambient, comprising the steps of:

depositing an organic silicon compound in a liquid solvent on to the semiconductor wafer;

removing oxygen proximate said semiconductor wafer with said silicon-based, low dielectric constant material in said solvent deposited thereon;

heating said semiconductor wafer with said silicon-based, low dielectric constant material in said solvent in the absence of oxygen at a temperature below the temperature at which said silicon-based, low dielectric constant material is oxidized into silicon dioxide and for a time too short to permit significant densification of said silicon-based, low dielectric constant material, whereby said silicon-based, low dielectric material is dried and the combination of removing the oxygen and heating prevents the reaction of oxygen to water, and above the temperature at which said solvent evaporates to reduce the dielectric constant.

10. The method as claimed in claim 9 wherein the step of:
removing oxygen includes the step of vacuum pumping.

11. The method as claimed in claim 9 wherein the step of:
removing oxygen includes the step of replacing the oxygen with nitrogen gas.

12. The method as claimed in claim 9 wherein the step of:
removing oxygen includes the step of replacing the oxygen with argon gas.

13. The method as claimed in claim 9 wherein the step of:
heating is continued until the dielectric constant of said silicon-based, low dielectric constant material is decreased below 2.7.

14. The method as claimed in claim 9 wherein the step of:
heating is continued until the dielectric constant of said silicon-based, low dielectric constant material is decreased below 2.7 and significant densification of said silicon-based, low dielectric constant material occurs to cause the dielectric constant to increase above its lowest value.

15. The method as claimed in claim 9 wherein the step of:
depositing said silicon-based, low dielectric constant material in a solvent on to the semiconductor wafer is done by a spinning process.

16. The method as claimed in claim 9 wherein said step of depositing an organic silicon compound in a liquid solvent on to the semiconductor wafer is immediately followed by the step of removing oxygen from around said silicon wafer.

17. The method as claimed in claim 9 wherein said step of depositing an organic silicon compound in a liquid solvent on to the semiconductor wafer is immediately followed by said step of heating said semiconductor wafer while said step of removing oxygen is performed.

18. A method for manufacturing a semiconductor wafer in an oxygen containing ambient, comprising the steps of:

depositing hydrogen silsesquioxane in methyl isobutyl ketone on to the semiconductor wafer;

removing oxygen from a chamber proximate said semiconductor wafer with said hydrogen silsesquioxane in methyl isobutyl ketone thereon;

heating said semiconductor wafer with said hydrogen silsesquioxane in methyl isobutyl ketone in the absence of oxygen in said chamber at a temperature below the temperature at which said silicon-based, low dielectric constant material is oxidized into silicon dioxide and for a time too short to permit significant densification of said silicon-based, low dielectric constant material, whereby said silicon-based, low dielectric material is dried and the combination of removing the oxygen and heating prevents the reaction of oxygen to water, and above the temperature at which said methyl isobutyl ketone and water in said hydrogen silsesquioxane evaporates to reduce the dielectric constant.

19. The method as claimed in claim 18 wherein the step of:

removing oxygen includes the step of vacuum pumping said chamber to at least $10^{-3}$ torr.

20. The method as claimed in claim 18 wherein the step of:

removing oxygen includes the step of replacing the oxygen in said chamber with nitrogen gas.

21. The method as claimed in claim 18 wherein the step of:

removing oxygen includes the step of replacing the oxygen in said chamber with argon gas.

22. The method as claimed in claim 18 wherein the step of:

heating is continued for at least one hour until the dielectric constant of said hydrogen silsesquioxane is decreased below 2.7.

23. The method as claimed in claim 18 wherein the step of:

heating is continued for at least forty-five minutes at around 400° C. until the dielectric constant of said hydrogen silsesquioxane is decreased below 2.7.

24. The method as claimed in claim 18 wherein the step of:

heating is continued for at least forty-five minutes at around 400° C. and not more than one hour and fifteen minutes.

25. The method as claimed in claim 18 wherein said step of depositing hydrogen silsesquioxane is immediately followed by said step of heating said silicon wafer.

26. The method as claimed in claim 18 wherein said step of depositing hydrogen silsesquioxane is immediately followed by said step of heating said silicon wafer while said step of removing oxygen is performed.

* * * * *